(12) United States Patent
Yang et al.

(10) Patent No.: US 8,633,100 B2
(45) Date of Patent: Jan. 21, 2014

(54) METHOD OF MANUFACTURING INTEGRATED CIRCUIT PACKAGING SYSTEM WITH SUPPORT STRUCTURE

(75) Inventors: DeokKyung Yang, Hanam-si (KR); In Sang Yoon, Ichon-si (KR); SangJin Lee, Seongnam-si (KR)

(73) Assignee: Stats Chippac Ltd., Singapore (SG)

( * ) Notice: Subject to any disclaimer, the term of this patent is extended or adjusted under 35 U.S.C. 154(b) by 94 days.

(21) Appl. No.: 13/163,643

(22) Filed: Jun. 17, 2011

(65) Prior Publication Data

US 2012/0319286 A1 Dec. 20, 2012

(51) Int. Cl.
*H01L 21/768* (2006.01)
(52) U.S. Cl.
USPC .......................................... 438/612
(58) Field of Classification Search
USPC ............... 257/773; 438/106, 127, 612
See application file for complete search history.

(56) References Cited

U.S. PATENT DOCUMENTS

| | | | |
|---|---|---|---|
| 7,185,426 B1 | 3/2007 | Hiner et al. | |
| 7,671,459 B2 | 3/2010 | Corisis et al. | |
| 7,777,351 B1 | 8/2010 | Berry et al. | |
| 7,923,304 B2 * | 4/2011 | Choi et al. | 438/127 |
| 8,067,306 B2 * | 11/2011 | Yang et al. | 438/612 |
| 2007/0164457 A1 | 7/2007 | Yamaguchi et al. | |
| 2008/0017968 A1 | 1/2008 | Choi et al. | |
| 2008/0258289 A1 * | 10/2008 | Pendse et al. | 257/690 |
| 2009/0250810 A1 * | 10/2009 | Pendse | 257/723 |
| 2010/0000775 A1 * | 1/2010 | Shen et al. | 174/260 |
| 2011/0140259 A1 | 6/2011 | Cho et al. | |
| 2012/0119360 A1 * | 5/2012 | Kim et al. | 257/737 |

\* cited by examiner

*Primary Examiner* — Nathan Ha
(74) *Attorney, Agent, or Firm* — Ishimaru & Associates LLP

(57) ABSTRACT

A method of manufacture of an integrated circuit packaging system includes: providing a substrate; forming a connection post on the substrate, the connection post having a post top and a post side; mounting an integrated circuit die on the substrate, the integrated circuit die having a top die surface; molding an encapsulation on the integrated circuit die and the connection post; and forming a connector recess in the encapsulation by removing the encapsulation around the connection post exposing a portion of the post side.

18 Claims, 5 Drawing Sheets

METHOD OF MANUFACTURING INTEGRATED CIRCUIT PACKAGING SYSTEM WITH SUPPORT STRUCTURE

TECHNICAL FIELD

The present invention relates generally to an integrated circuit packaging system, and more particularly to a system with a support structure.

BACKGROUND ART

Electronic products have become an integral part of our daily lives. This has created a consistent if not increasing expectation for new features, higher speed, more data, improved portability, etc. These demands have driven the development of electronic technology to reduce size, improve utility, decrease cost, and increase performance of the integrated circuit devices in an ever-increasing range of products such as cell phones, music players, televisions, and automobiles.

Packages of components such as semiconductor circuits, transistors, diodes, and other electronic devices must also become smaller and thinner with more functions and connections. In packaging components, manufacturing stacked integrated circuits in a manner that leads to high throughput and yield is essential.

However, mass-production of stacked integrated circuits is hampered by decreased sizes and the related decrease in tolerances for connectors. Improper connection can result in decreased reliability and yield.

Thus, a need still remains for an integrated circuit packaging system with a way of meeting stricter tolerances. In view of the shrinking sizes of integrated circuits, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate; forming a connection post on the substrate, the connection post having a post top and a post side; mounting an integrated circuit die on the substrate, the integrated circuit die having a top die surface; molding an encapsulation on the integrated circuit die and the connection post; and forming a connector recess in the encapsulation by removing the encapsulation around the connection post exposing a portion of the post side.

The present invention provides an integrated circuit packaging system, including: a substrate; a connection post formed on the substrate, the connection post having a post top and a post side; an integrated circuit die mounted on the substrate, the integrated circuit die having a top die surface; and an encapsulation molded on the integrated circuit die and the connection post, the encapsulation having a connector recess in the encapsulation around the connection post exposing a portion of the post side.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
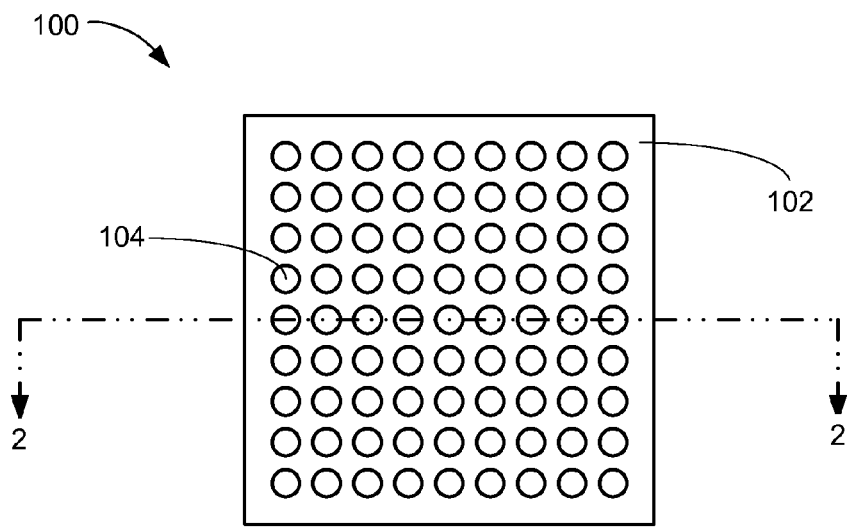
FIG. 1 is a bottom view of the integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the substrate having contacts, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

Referring now to FIG. 1, therein is shown a bottom view of the integrated circuit packaging system 100 in a first embodiment of the present invention. The integrated circuit packaging system 100 is shown having a substrate 102 and an external interconnect 104. The substrate 102 is defined as a structure containing conductive traces and contacts. For example, the substrate 102 can be a laminate substrate, a ceramic substrate, or some other laminated structure for redistribution of signals. The external interconnect 104 can be attached to the substrate 102.

The external interconnect 104 is defined as an interface connector. For example, the external interconnect 104 can be a solder ball, a solder bump, a stud bump, a conductive pillar, or other conductive structure.

Figure 2:
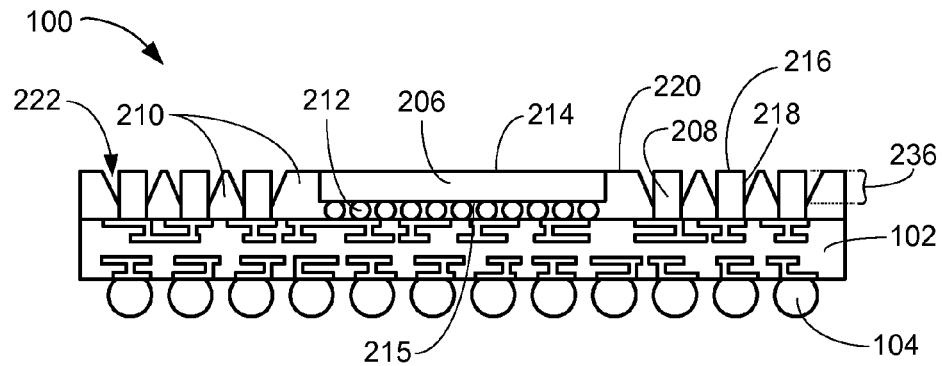
FIG. 2 is a cross-sectional view of the integrated circuit packaging system along the section line 2-2 of FIG. 1.

Referring now to FIG. 2, therein is shown a cross-sectional view of the integrated circuit packaging system 100 along the section line 2-2 of FIG. 1. The integrated circuit packaging system 100 is shown having an integrated circuit die 206, a connection post 208, an encapsulation 210, the substrate 102, and the external interconnect 104, as an example.

The integrated circuit die 206 can be mounted on the substrate 102 and connected to the substrate 102 through an internal interconnect 212. For example, the integrated circuit die 206 can be a flip chip, a wire-bond chip, or other type of chip. The integrated circuit die 206 can include a top die surface 214. The top die surface 214 is defined as the non-active surface of the integrated circuit die 206. The integrated circuit die 206 can have an active side 215 opposite the top die surface 214. The active side 215 is defined as the side of the integrated circuit die 206 having active circuitry fabricated thereon.

The internal interconnect 212 is defined as an electrical connector. For example, the internal interconnect 212 can be a solder ball, a solder bump, or a conductive column.

The internal interconnect 212 can be on and between the integrated circuit die 206 and the substrate 102. In this example, the internal interconnect 212 can also support the integrated circuit die 206 over the substrate 102.

The connection post 208 can be attached to the substrate 102 around the integrated circuit die 206. The connection post 208 is defined as a connection structure that also performs a support function. For example, the connection post 208 can be a post, a pillar, a cylinder, or other pre-formed conductive support structure. Also for example, the connection post 208 can be covered in a protective coating (not shown) to prevent oxidation or corrosion of the connection post 208. The protective coating can be a material that does not easily oxidize such as a layer of nickel under a layer of gold, for example.

The connection post 208 can have a post top 216 and a post side 218. The post top 216 is defined as the surface of the connection post 208 opposite the substrate 102. For example, the post top 216 can be a flat surface. The post side 218 is defined as the non-horizontal surface of the connection post 208. For example, the post side 218 can extend from the top of the substrate 102 to the post top 216.

There can be multiple instances of the connection post 208 on the substrate 102. The plurality of the connection post 208 can be in an array and regularly spaced from each other. The connection post 208 can be adjacent to and around the integrated circuit die 206. The post top 216 of the connection post 208 can be coplanar with the top die surface 214 of the integrated circuit die 206. The post top 216 of the instances of the connection post 208 can be coplanar with each other and with the top die surface 214. The instances of the connection post 208 can be separated by the encapsulation 210.

The encapsulation 210 is defined as a molding compound. For example, the encapsulation 210 can be a film assisted molding, epoxy molding, or other protective molding, and can protect sensitive components from moisture, dust and other contamination. The encapsulation 210 can be molded on the substrate 102, the integrated circuit die 206, and the connection post 208. The encapsulation 210 includes a top encapsulation surface 220 and a connector recess 222. The top encapsulation surface 220 can be coplanar with the top die surface 214 and the post top 216. The sides of the encapsulation 210 can be planar and coplanar with the sides of the substrate 102.

The connector recess 222 is defined as a depression in the encapsulation 210 around the connection post 208. The connector recess 222 can have many characteristics. For example, the connector recess 222 can be wider at the top than the bottom, and as a result can have slanted sides at an obtuse angle relative to the top surface of the substrate 102. The connector recess 222 can leave the post side 218 partially exposed. The connector recess 222 can be shaped as a funnel centered around the connection post 208. The top encapsulation surface 220 can be removed so at all points the top encapsulation surface 220 is equidistant from the post top 216.

The top encapsulation surface 220 can be between the instances of the connector recess 222. The connector recess 222 can have a recess depth 236. The recess depth 236 is defined as the distance from the top of the connector recess 222 to the bottom of the connector recess 222. For example, the recess depth 236 can be the distance from the top encapsulation surface 220 to the point where the encapsulation 210 contacts the post side 218 of the connection post 208. The recess depth 236 of the connector recess 222 can vary in magnitude. For example, the connector recess 222 can expose half the post side 218.

It has been discovered that the connector recess 222 leaving a gap between the encapsulation 210 and the connection post 208 helps to compensate for misalignment of a solder ball placed on the connection post 208. For example, if the connector recess 222 does not leave a gap around the post top 216 between the post top 216 and the encapsulation 210, a misaligned solder ball may just rest on the top encapsulation surface 220 where it does not contact the post top 216 or cause inadvertent shorting or bridging between the adjacent locations of the connection post 208. Conversely, if the encapsulation 210 has the connector recess 222 leaving a gap around the post top 216, a misaligned solder ball will naturally come into better alignment with the post top 216 as the surface tension of the solder ball which helps keep the solder ball in a spherical shape will pull the solder ball towards the post top 216 as there is no other supporting structure for the solder ball to rest on.

The connector recess 222 can be formed in various ways. For example, the connector recess 222 can be formed by removing portions of the encapsulation 210 from around the connection post 208. This removal process can be by laser ablation, etching, sawing, or drilling, for example. The connector recess 222 can be formed after the encapsulation 210 is molded on the connection post 208 and the integrated circuit die 206.

The encapsulation 210 can be molded in such a way so that the top encapsulation surface 220, the top die surface 214, and the post top 216 are all coplanar. After the encapsulation 210 is molded, the removal of the encapsulation 210 around the connection post 208 can proceed, and can expose the post side 218 in the process. Some of the encapsulation 210 can remain between the instances of the connection post 208.

Figure 3:
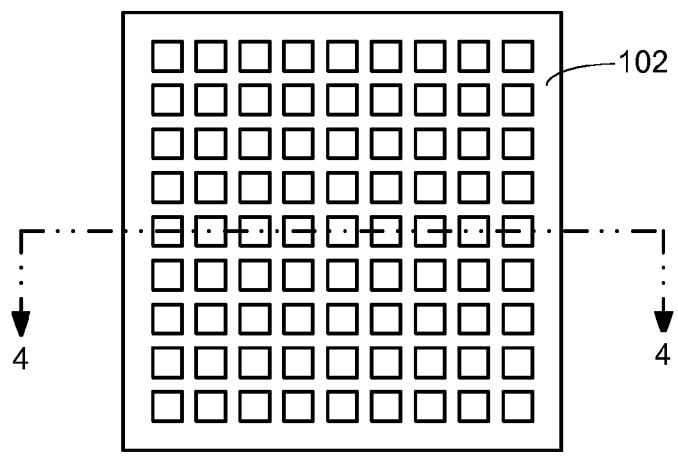
FIG. 3 is a bottom view of the substrate in a manufacturing step of the integrated circuit packaging system.

Referring now to FIG. 3, therein is shown a bottom view of the substrate 102 in a manufacturing step of the integrated circuit packaging system 100. The substrate 102 is shown with contacts for later attachment of the external interconnect 104 of FIG. 1.

For illustrative purposes, the substrate 102 is shown with the contacts in a regular, full matrix pattern, although it is understood that the substrate 102 can be different. For example, the substrate 102 can have the contacts in a non-fully populated matrix pattern, only along the perimeter of the substrate 102, or randomly distributed.

Figure 4:
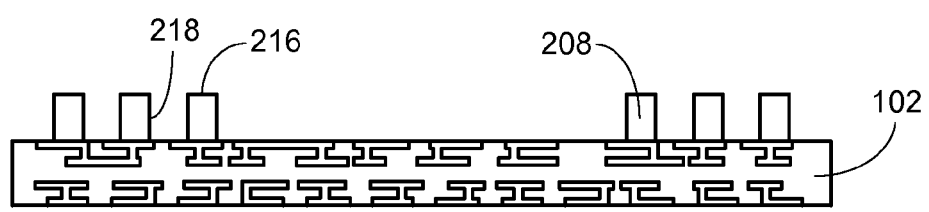
FIG. 4 is a cross-sectional view of the substrate along the section line 4-4 of FIG. 3.

Referring now to FIG. 4, therein is shown a cross-sectional view of the substrate 102 along the section line 4-4 of FIG. 3. The substrate 102 is shown with the connection post 208 attached to the substrate 102. The connection post 208 is shown in this manufacturing step with the post top 216 and the post side 218 exposed.

Figure 5:
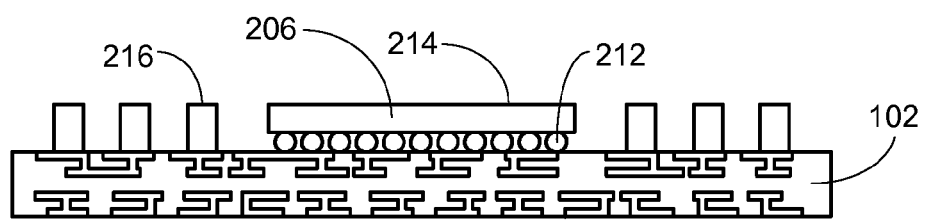
FIG. 5 is the structure of FIG. 4 in mounting the integrated circuit die on the substrate.

Referring now to FIG. 5, therein is shown the structure of FIG. 4 in mounting the integrated circuit die 206 on the substrate 102. The integrated circuit die 206 is shown attached to the substrate 102 with the internal interconnect 212. The integrated circuit die 206 can be mounted between instances of the connection post 208 in the center of the substrate 102. The top die surface 214 can be coplanar with the post top 216.

Figure 6:
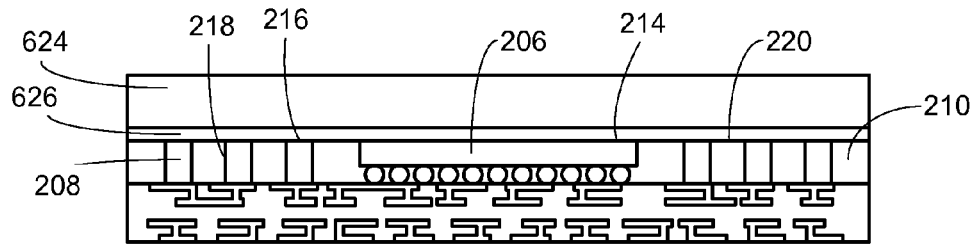
FIG. 6 is the structure of FIG. 5 in molding the encapsulation.

Referring now to FIG. 6, therein is shown the structure of FIG. 5 in molding the encapsulation 210. The encapsulation 210 is shown molded on the integrated circuit die 206 and the connection post 208, the shape of the encapsulation 210 formed by a mold chase 624 and an assist film 626. The mold chase 624 and the assist film 626 are shown after the encapsulation 210 has been molded but before removal of the mold chase 624 and the assist film 626.

The assist film 626 is defined as a thin renewable film that conforms to underlying structures. For example, the assist film 626 can be a deformable seal film, an adhesive film, or other protective film on the mold chase 624.

The mold chase 624 and the assist film 626 can be used in different ways to control the shape of the encapsulation 210. For example, the mold chase 624 and the assist film 626 can be positioned directly on the top die surface 214 and the post top 216 prior to molding the encapsulation 210. The encapsulation 210 can cover all other surfaces of the integrated circuit die 206 and the connection post 208 such as the post side 218. After removal of the mold chase 624 and the assist film 626, the top die surface 214 and the post top 216 can be exposed from the encapsulation 210. The mold chase 624 and the assist film 626 can define a planar surface so that the top encapsulation surface 220, the top die surface 214, and the post top 216 can all be coplanar.

For illustrative purposes, the mold chase 624 is shown with the assist film 626 although it is understood that the assist film 626 is an optional component. For example, the mold chase 624 can be used without the assist film 626.

The top encapsulation surface 220 can be characterized by the physical characteristics of the assist film 626 or the mold chase 624. For example, the assist film 626 can cause the top encapsulation surface 220 to be smoother than with the use of the mold chase 624 due to the assist film 626 flattening out during the process of forming the encapsulation 210. The top encapsulation surface 220 can have slight scratches on it if only the mold chase 624 is used due to microscopic imperfections in the mold chase 624. Also for example, there can be a rough surface or scratches on the post top 216 and the top die surface 214 if only the mold chase 624 is used because of the hardness of the features of the mold chase 624 pressed onto the post top 216 and the top die surface 214. The assist film 626 being used can leave the post top 216 and the top die surface 214 with an unblemished surface due to the softness of the assist film 626.

Figure 7:
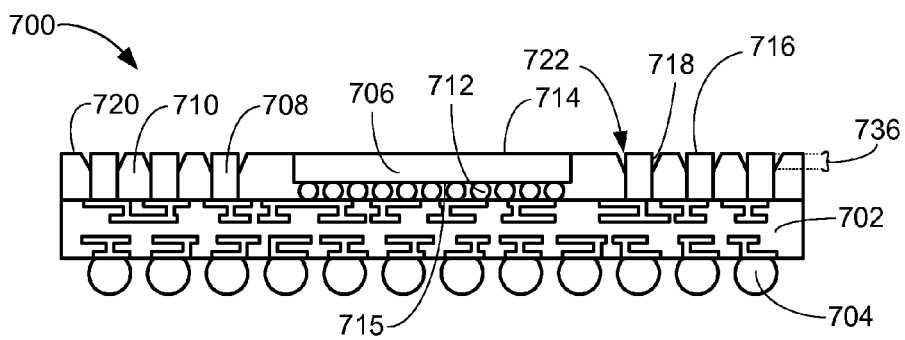
FIG. 7 is a cross-sectional view of the integrated circuit packaging system as exemplified by the bottom view of FIG. 1 and along the section line 2-2 of FIG. 1 in a second embodiment of the present invention.

Referring now to FIG. 7, therein is shown a cross-sectional view of the integrated circuit packaging system 700 as exemplified by the bottom view of FIG. 1 and along the section line 2-2 of FIG. 1 in a second embodiment of the present invention. The integrated circuit packaging system 700 is shown having an integrated circuit die 706, a connection post 708, an encapsulation 710, the substrate 702, and the external interconnect 704, as an example.

The integrated circuit die 706 can be mounted on the substrate 702 and connected to the substrate 702 through an internal interconnect 712. For example, the integrated circuit die 706 can be a flip chip, a wire-bond chip, or other type of chip. The integrated circuit die 706 can include a top die surface 714. The top die surface 714 is defined as the non-active surface of the integrated circuit die 706. The integrated circuit die 706 can have an active side 715 opposite the top die surface 714. The active side 715 is defined as the side of the integrated circuit die 706 having active circuitry fabricated thereon.

The internal interconnect 712 is defined as an electrical connector. For example, the internal interconnect 712 can be a solder ball, a solder bump, or a conductive column.

The internal interconnect 712 can be on and between the integrated circuit die 706 and the substrate 702. In this example, the internal interconnect 712 can also support the integrated circuit die 706 over the substrate 702.

The connection post 708 can be attached to the substrate 702 around the integrated circuit die 706. The connection post 708 is defined as a connection structure that also performs a support function. For example, the connection post 708 can be a post, a pillar, a cylinder, or other pre-formed conductive support structure. Also for example, the connection post 708 can be covered in a protective coating (not shown) to prevent oxidation or corrosion of the connection post 708. The protective coating can be a material that does not easily oxidize such as a layer of nickel under a layer of gold, for example.

The connection post 708 can have a post top 716 and a post side 718. The post top 716 is defined as the surface of the connection post 708 opposite the substrate 702. For example, the post top 716 can be a flat surface. The post side 718 is defined as the non-horizontal surface of the connection post 708. For example, the post side 718 can extend from the top of the substrate 702 to the post top 716.

There can be multiple instances of the connection post 708 on the substrate 702. The plurality of the connection post 708 can be in an array and regularly spaced from each other. The connection post 708 can be adjacent to and around the integrated circuit die 706. The post top 716 of the connection post 708 can be coplanar with the top die surface 714 of the integrated circuit die 706. The post top 716 of the instances of the connection post 708 can be coplanar with each other and with the top die surface 714. The instances of the connection post 708 can be separated by the encapsulation 710.

The encapsulation 710 is defined as a molding compound. For example, the encapsulation 710 can be a film assisted molding, epoxy molding, or other protective molding, and can protect sensitive components from moisture, dust and other contamination. The encapsulation 710 can be molded on the substrate 702, the integrated circuit die 706, and the connection post 708. The encapsulation 710 includes a top encapsulation surface 720 and a connector recess 722. The top encapsulation surface 720 can be coplanar with the top die surface 714 and the post top 716. The sides of the encapsulation 710 can be planar and coplanar with the sides of the substrate 702.

The connector recess 722 is defined as a depression in the encapsulation 710 around the connection post 708. The connector recess 722 can have many characteristics. For example, the connector recess 722 can be wider at the top than the bottom, and as a result can have slanted sides at an obtuse angle relative to the top surface of the substrate 702. The connector recess 722 can leave the post side 718 partially exposed. The connector recess 722 can be shaped as a funnel centered around the connection post 708. The top encapsulation surface 720 can be removed so at all points the top encapsulation surface 720 is equidistant from the post top 716.

The top encapsulation surface 720 can be between the instances of the connector recess 722. The connector recess 722 can have a recess depth 736. The recess depth 736 is defined as the distance from the top of the connector recess 722 to the bottom of the connector recess 722. For example, the recess depth 736 can be the distance from the top encapsulation surface 720 to the point where the encapsulation 710 contacts the post side 718 of the connection post 708. The recess depth 736 of the connector recess 722 can vary in magnitude. The recess depth 736 and size of the connector recess 722 can be adjusted for various reasons. For example, the recess depth 736 and size of the connector recess 722 can be modified because of the pitch of the instances of the connection post 708, spacing requirements, or solder ball size. For example, the connector recess 722 can expose roughly a quarter of the post side 718.

It has been discovered that the connector recess 722 leaving a gap between the encapsulation 710 and the connection post 708 helps to compensate for misalignment of a solder ball placed on the connection post 708. For example, if the connector recess 722 does not leave a gap around the post top 716 between the post top 716 and the encapsulation 710, a misaligned solder ball may just rest on the top encapsulation surface 720 where it does not contact the post top 716 or cause inadvertent shorting or bridging between the adjacent locations of the connection post 708. Conversely, if the encapsulation 710 has the connector recess 722 leaving a gap around the post top 716, a misaligned solder ball will naturally come into better alignment with the post top 716 as the surface tension of the solder ball which helps keep the solder ball in a spherical shape will pull the solder ball towards the post top 716 as there is no other supporting structure for the solder ball to rest on.

The connector recess 722 can be formed in various ways. For example, the connector recess 722 can be formed by removing portions of the encapsulation 710 from around the connection post 708. This removal process can be by laser ablation, etching, sawing, or drilling, for example. The connector recess 722 can be formed after the encapsulation 710 is molded on the connection post 708 and the integrated circuit die 706.

The encapsulation 710 can be molded in such a way so that the top encapsulation surface 720, the top die surface 714, and the post top 716 are all coplanar. After the encapsulation 710 is molded, the removal of the encapsulation 710 around the connection post 708 can proceed, and can expose the post side 718 in the process. Some of the encapsulation 710 can remain between the instances of the connection post 708.

Figure 8:
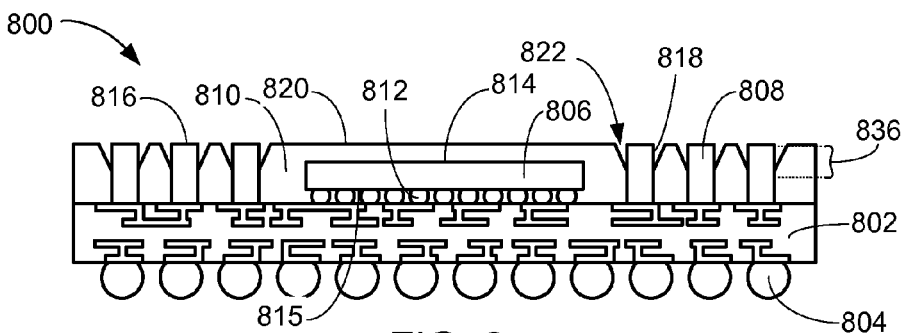
FIG. 8 is a cross-sectional view of the integrated circuit packaging system as exemplified by the bottom view of FIG. 1 and along the section line 2-2 of FIG. 1 in a third embodiment of the present invention.

Referring now to FIG. 8, therein is shown a cross-sectional view of the integrated circuit packaging system 800 as exemplified by the bottom view of FIG. 1 and along the section line 2-2 of FIG. 1 in a third embodiment of the present invention. The integrated circuit packaging system 800 is shown having an integrated circuit die 806, a connection post 808, an encapsulation 810, the substrate 802, and the external interconnect 804, as an example.

The integrated circuit die 806 can be mounted on the substrate 802 and connected to the substrate 802 through an internal interconnect 812. For example, the integrated circuit die 806 can be a flip chip, a wire-bond chip, or other type of chip. The integrated circuit die 806 can include a top die surface 814. The top die surface 814 is defined as the non-active surface of the integrated circuit die 806. The integrated circuit die 806 can have an active side 815 opposite the top die surface 814. The active side 815 is defined as the side of the integrated circuit die 806 having active circuitry fabricated thereon.

The internal interconnect 812 is defined as an electrical connector. For example, the internal interconnect 812 can be a solder ball, a solder bump, or a conductive column.

The internal interconnect 812 can be on and between the integrated circuit die 806 and the substrate 802. In this example, the internal interconnect 812 can also support the integrated circuit die 806 over the substrate 802.

The connection post 808 can be attached to the substrate 802 around the integrated circuit die 806. The connection post 808 is defined as a connection structure that also performs a support function. For example, the connection post 808 can be a post, a pillar, a cylinder, or other pre-formed conductive support structure. Also for example, the connection post 808 can be covered in a protective coating (not shown) to prevent oxidation or corrosion of the connection post 808. The protective coating can be a material that does not easily oxidize such as a layer of nickel under a layer of gold, for example.

The connection post 808 can have a post top 816 and a post side 818. The post top 816 is defined as the surface of the connection post 808 opposite the substrate 802. For example, the post top 816 can be a flat surface. The post side 818 is defined as the non-horizontal surface of the connection post 808. For example, the post side 818 can extend from the top of the substrate 802 to the post top 816.

There can be multiple instances of the connection post 808 on the substrate 802. The plurality of the connection post 808 can be in an array and regularly spaced from each other. The connection post 808 can be adjacent to and around the integrated circuit die 806. The post top 816 of the instances of the connection post 808 can be coplanar with each other. The instances of the connection post 808 can be separated by the encapsulation 810.

The encapsulation 810 is defined as a molding compound. For example, the encapsulation 810 can be a film assisted molding, epoxy molding, or other protective molding, and can protect sensitive components from moisture, dust and other contamination. The encapsulation 810 can be molded on the substrate 802, the integrated circuit die 806, and the connection post 808. The encapsulation 810 includes a top encapsulation surface 820 and a connector recess 822. The sides of the encapsulation 810 can be planar and coplanar with the sides of the substrate 802.

The integrated circuit die 806 can be fully covered by the encapsulation 810. The top encapsulation surface 820 and the post top 816 can be coplanar, but the top die surface 814 can be lower than both the top encapsulation surface 820 and the post top 816.

It has been discovered that the encapsulation 810 fully covering the integrated circuit die 806 can improve the structural integrity of the integrated circuit packaging system 800 and reduce warpage due to thermal stress. The extra thickness of the encapsulation 810 can stiffen the entire package and provide greater resistance to warpage caused by differing coefficients of thermal expansion.

The connector recess 822 is defined as a depression in the encapsulation 810 around the connection post 808. The connector recess 822 can have many characteristics. For example, the connector recess 822 can be wider at the top than the bottom, and as a result can have slanted sides at an obtuse angle relative to the top surface of the substrate 802. The connector recess 822 can leave the post side 818 partially exposed. The connector recess 822 can be shaped as a funnel centered around the connection post 808. The top encapsulation surface 820 can be removed so at all points the top encapsulation surface 820 is equidistant from the post top 816.

The top encapsulation surface 820 can be between the instances of the connector recess 822. The connector recess 822 can have a recess depth 836. The recess depth 836 is defined as the distance from the top of the connector recess 822 to the bottom of the connector recess 822. For example, the recess depth 836 can be the distance from the top encapsulation surface 820 to the point where the encapsulation 810 contacts the post side 818 of the connection post 808. The recess depth 836 of the connector recess 822 can vary in magnitude. For example, the connector recess 822 can expose half the post side 818.

It has been discovered that the connector recess 822 leaving a gap between the encapsulation 810 and the connection post 808 helps to compensate for misalignment of a solder ball placed on the connection post 808. For example, if the connector recess 822 does not leave a gap around the post top 816 between the post top 816 and the encapsulation 810, a misaligned solder ball may just rest on the top encapsulation surface 820 where it does not contact the post top 816 or cause inadvertent shorting or bridging between the adjacent locations of the connection post 808. Conversely, if the encapsulation 810 has the connector recess 822 leaving a gap around the post top 816, a misaligned solder ball will naturally come into better alignment with the post top 816 as the surface tension of the solder ball which helps keep the solder ball in a spherical shape will pull the solder ball towards the post top 816 as there is no other supporting structure for the solder ball to rest on.

The connector recess 822 can be formed in various ways. For example, the connector recess 822 can be formed by removing portions of the encapsulation 810 from around the connection post 808. This removal process can be by laser ablation, etching, sawing, or drilling, for example. The connector recess 822 can be formed after the encapsulation 810 is molded on the connection post 808 and the integrated circuit die 806.

The encapsulation 810 can be molded in such a way so that the top encapsulation surface 820 and the post top 816 are coplanar. After the encapsulation 810 is molded, the removal of the encapsulation 810 around the connection post 808 can proceed, and can expose the post side 818 in the process. Some of the encapsulation 810 can remain between the instances of the connection post 808.

Figure 9:
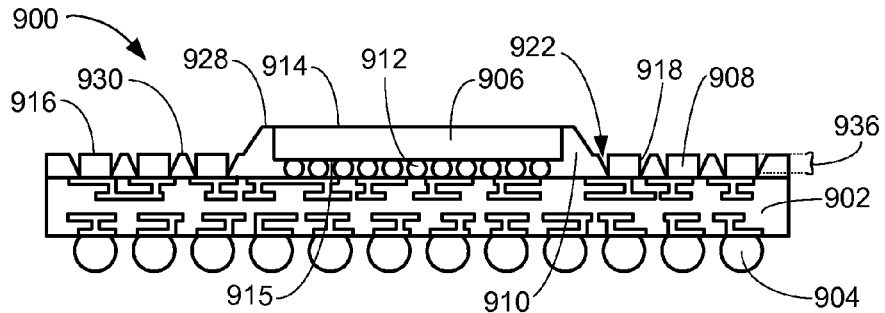
FIG. 9 is a cross-sectional view of the integrated circuit packaging system as exemplified by the bottom view of FIG. 1 and along the section line 2-2 of FIG. 1 in a fourth embodiment of the present invention.

Referring now to FIG. 9, therein is shown a cross-sectional view of the integrated circuit packaging system 900 as exemplified by the bottom view of FIG. 1 and along the section line 2-2 of FIG. 1 in a fourth embodiment of the present invention. The integrated circuit packaging system 900 is shown with the same features as the integrated circuit packaging system 100 of FIG. 2 with the encapsulation 910 molded with a step mold rather than the mold chase 624 of FIG. 6. The integrated circuit packaging system 900 is shown having an integrated circuit die 906, a connection post 908, an encapsulation 910, the substrate 902, and the external interconnect 904, as an example.

The integrated circuit die 906 can be mounted on the substrate 902 and connected to the substrate 902 through an internal interconnect 912. For example, the integrated circuit die 906 can be a flip chip, a wire-bond chip, or other type of chip. The integrated circuit die 906 can include a top die surface 914. The top die surface 914 is defined as the non-active surface of the integrated circuit die 906. The integrated circuit die 906 can have an active side 915 opposite the top die surface 914. The active side 915 is defined as the side of the integrated circuit die 906 having active circuitry fabricated thereon.

The internal interconnect 912 is defined as an electrical connector. For example, the internal interconnect 912 can be a solder ball, a solder bump, or a conductive column.

The internal interconnect 912 can be on and between the integrated circuit die 906 and the substrate 902. In this example, the internal interconnect 912 can also support the integrated circuit die 906 over the substrate 902.

The connection post 908 can be attached to the substrate 902 around the integrated circuit die 906. The connection post 908 is defined as a connection structure that also performs a support function. For example, the connection post 908 can be a post, a pillar, a cylinder, or other pre-formed conductive support structure. Also for example, the connection post 908 can be covered in a protective coating (not shown) to prevent oxidation or corrosion of the connection post 908. The protective coating can be a material that does not easily oxidize such as a layer of nickel under a layer of gold, for example.

The connection post 908 can have a post top 916 and a post side 918. The post top 916 is defined as the surface of the connection post 908 opposite the substrate 902. For example, the post top 916 can be a flat surface. The post side 918 is defined as the non-horizontal surface of the connection post 908. For example, the post side 918 can extend from the top of the substrate 902 to the post top 916.

There can be multiple instances of the connection post 908 on the substrate 902. The plurality of the connection post 908 can be in an array and regularly spaced from each other. The connection post 908 can be adjacent to and around the integrated circuit die 906. The post top 916 of the connection post 908 can be lower in height than the top die surface 914 of the integrated circuit die 906. The post top 916 of the instances of the connection post 908 can be coplanar with each other. The instances of the connection post 908 can be separated by the encapsulation 910.

The encapsulation 910 is defined as a molding compound. For example, the encapsulation 910 can be a film assisted molding, epoxy molding, or other protective molding, and can protect sensitive components from moisture, dust and other contamination. The encapsulation 910 can be molded on the substrate 902, the integrated circuit die 906, and the connection post 908. The encapsulation 910 includes a connector recess 922. The encapsulation 910 can include an upper top encapsulation surface 928 and a lower top encapsulation surface 930. The sides of the encapsulation 910 can be planar and coplanar with the sides of the substrate 902.

The step mold can cause the encapsulation 910 to have a two level shape, with a higher level centered around the integrated circuit die 906, and a lower level over the instances of the connection post 908. The transition between the two levels can be at an angle so that the encapsulation 910 around the integrated circuit die 906 is wider at the bottom than the top. The two level shape can create an upper top encapsulation surface 928 and a lower top encapsulation surface 930.

The upper top encapsulation surface 928 on the higher level can be coplanar with the top die surface 914. The lower top encapsulation surface 930 on the lower level can be coplanar with the post top 916. In this example, the post top 916 can be at a lower height than the top die surface 914.

The connector recess 922 is defined as a depression in the encapsulation 910 around the connection post 908. The connector recess 922 can have many characteristics. For example, the connector recess 922 can be wider at the top than the bottom, and as a result can have slanted sides at an obtuse angle relative to the top surface of the substrate 902. The connector recess 922 can leave the post side 918 partially exposed. The connector recess 922 can be shaped as a funnel centered around the connection post 908. The top encapsulation surface 920 can be removed so at all points the top encapsulation surface 920 is equidistant from the post top 916.

The top encapsulation surface 920 can be between the instances of the connector recess 922. The connector recess 922 can have a recess depth 936. The recess depth 936 is defined as the distance from the top of the connector recess 922 to the bottom of the connector recess 922. For example, the recess depth 936 can be the distance from the top encapsulation surface 920 to the point where the encapsulation 910 contacts the post side 918 of the connection post 908. The recess depth 936 of the connector recess 922 can vary in magnitude. For example, the connector recess 922 can expose 80% of the post side 918.

It has been discovered that the connector recess 922 leaving a gap between the encapsulation 910 and the connection post 908 helps to compensate for misalignment of a solder ball placed on the connection post 908. For example, if the connector recess 922 does not leave a gap around the post top 916 between the post top 916 and the encapsulation 910, a misaligned solder ball may just rest on the top encapsulation surface 920 where it does not contact the post top 916 or cause inadvertent shorting or bridging between the adjacent locations of the connection post 908. Conversely, if the encapsulation 910 has the connector recess 922 leaving a gap around the post top 916, a misaligned solder ball will naturally come into better alignment with the post top 916 as the surface tension of the solder ball which helps keep the solder ball in a spherical shape will pull the solder ball towards the post top 916 as there is no other supporting structure for the solder ball to rest on.

The connector recess 922 can be formed in various ways. For example, the connector recess 922 can be formed by removing portions of the encapsulation 910 from around the connection post 908. This removal process can be by laser ablation, etching, sawing, or drilling, for example. The connector recess 922 can be formed after the encapsulation 910 is molded on the connection post 908 and the integrated circuit die 906.

The encapsulation 910 can be molded in such a way so that the top encapsulation surface 920, the top die surface 914, and the post top 916 are all coplanar. After the encapsulation 910 is molded, the removal of the encapsulation 910 around the connection post 908 can proceed, and can expose the post side 918 in the process. Some of the encapsulation 910 can remain between the instances of the connection post 908.

Figure 10:
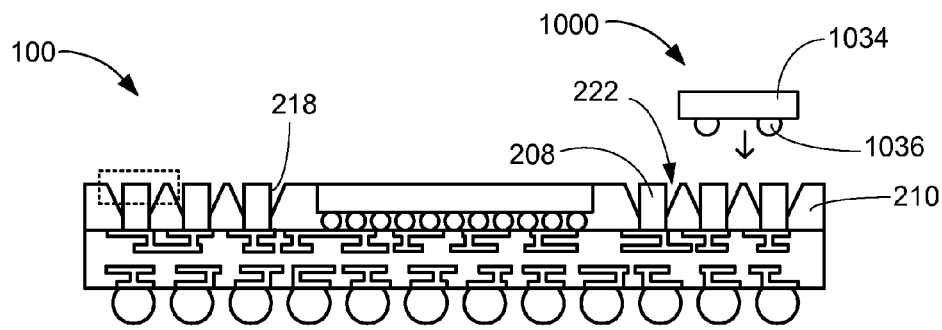
FIG. 10 is a cross-sectional view of the integrated circuit packaging system along the section line 2-2 of FIG. 1 with an integrated circuit device ready for mounting.

Referring now to FIG. 10, therein is shown a cross-sectional view of the integrated circuit packaging system 100 along the section line 2-2 of FIG. 1 with an integrated circuit device 1000 ready for mounting. The integrated circuit packaging system 100 is shown with the same features as FIG. 2. The integrated circuit device 1000 is shown with a discrete component 1034 and a device interconnect 1036 such as a solder ball.

The integrated circuit device 1000 can be mounted in any location on the integrated circuit packaging system 100 as long as the device interconnect 1036 contacts the connection post 208. The device interconnect 1036 can be mounted out of alignment with the connection post 208. The connector recess 222 between the encapsulation 210 and the connection post 208 can prevent the device interconnect 1036 from contacting the encapsulation 210. The post side 218 can be exposed from the encapsulation 210.

Figure 11:
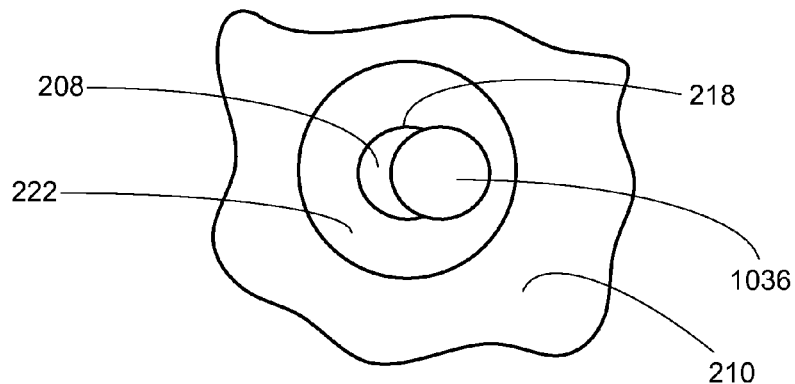
FIG. 11 is a partial top view of FIG. 10 within the inset depicted by the dotted rectangle 11 of FIG. 10.

Referring now to FIG. 11, therein is shown a partial top view of FIG. 10 within the inset depicted by the dotted rectangle of FIG. 10. The partial top view of FIG. 10 is shown having the encapsulation 210, the connector recess 222, the connection post 208 having the post side 218, and a device interconnect 1036, as an example. Features shown are identical to those shown in FIG. 10 but are larger and further described for clarity.

The device interconnect 1036 is shown misaligned on the connection post 208. The connection post 208 and the connector recess 222 can take different shapes. For example, if the connection post 208 is a cylinder, the connector recess 222 would appear circular when viewed from above. The connector recess 222 can be shaped as a funnel centered around the connection post 208. The encapsulation 210 can be removed so at all points the encapsulation 210 is equidistant from the post side 218.

It has been discovered that the connector recess 222 leaving a gap between the encapsulation 210 and the connection post 208 helps to compensate for misalignment of the device interconnect 1036 placed on the connection post 208. For example, if the connector recess 222 does not leave a gap around the connection post 208 and the encapsulation 210, the misaligned instance of the device interconnect 1036 may just rest on the top encapsulation surface 220 where it does not contact the connection post 208 or cause inadvertent shorting or bridging between the adjacent locations of the connection post 208. Conversely, if the encapsulation 210 has the connector recess 222 leaving a gap around the connection post 208, the device interconnect 1036 such as a solder ball will naturally come into better alignment with the connection post 208 as the surface tension of the solder ball which helps keep the solder ball in a spherical shape will pull the solder ball towards the connection post 208 as there is no other supporting structure for the device interconnect 1036 to rest on.

Figure 12:
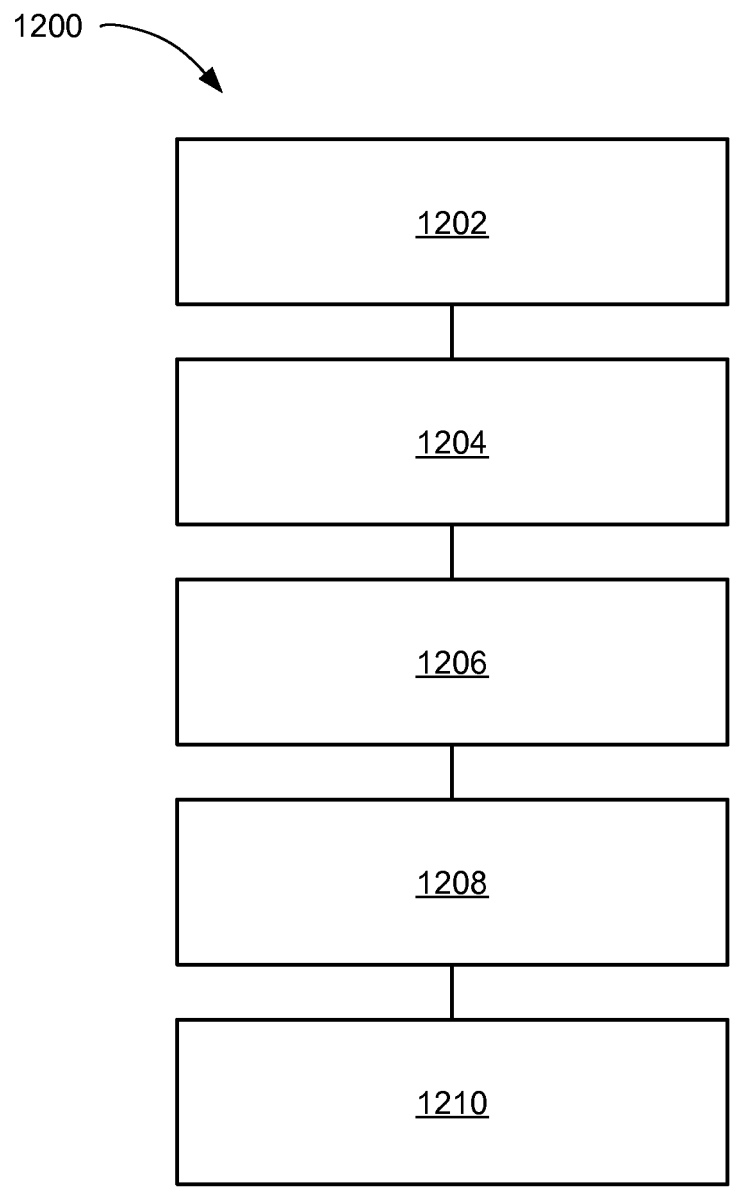
FIG. 12 is a flow chart of a method of manufacture of the integrated circuit packaging system in a further embodiment of the present invention.

Referring now to FIG. 12, therein is shown a flow chart of a method 1200 of manufacture of the integrated circuit packaging system in a further embodiment of the present invention. The method 1200 includes: providing a substrate in a block 1202; forming a connection post on the substrate, the connection post having a post top and a post side in a block 1204; mounting an integrated circuit die on the substrate, the integrated circuit die having a top die surface in a block 1206; molding an encapsulation on the integrated circuit die and the connection post in a block 1208; and forming a connector recess in the encapsulation by removing the encapsulation around the connection post exposing a portion of the post side in a block 1210.

Thus, it has been discovered that the integrated circuit packaging system 100 and the connector recess 222 of the present invention furnish important and heretofore unknown and unavailable solutions, capabilities, and functional aspects for dealing with misaligned solder balls.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a substrate:
   forming a connection post on the substrate, the connection post having a post top and a post side;
   mounting an integrated circuit die on the substrate, the integrated circuit die having a top die surface;
   molding an encapsulation on the integrated circuit die and the connection post; and
   forming a connector recess in the encapsulation by removing the encapsulation around the connection post exposing a portion of the post side for forming a funnel-shaped recess centered around the connection post.

2. The method as claimed in claim 1 wherein:
   molding the encapsulation includes molding a top encapsulation surface of the encapsulation coplanar with the post top; and
   further comprising:
   attaching an external interconnect to the substrate.

3. The method as claimed in claim 1 wherein molding the encapsulation on the integrated circuit die includes fully covering the integrated circuit die with the encapsulation.

4. The method as claimed in claim 1 wherein forming the connection post on the substrate includes attaching the connection post having a post top lower than the top die surface.

5. A method of manufacture of an integrated circuit packaging system comprising:
   providing a substrate;
   forming a connection post on the substrate, the connection post having a post top and a post side;
   mounting an integrated circuit die on the substrate, the integrated circuit die having a top die surface;
   molding an encapsulation on the integrated circuit die and the connection post;
   forming a connector recess in the encapsulation by removing the encapsulation around the connection post exposing a portion of the post side for forming a funnel-shaped recess centered around the connection post; and
   attaching an external interconnect to the substrate.

6. The method as claimed in claim 5 wherein molding the encapsulation on the integrated circuit die includes exposing the top die surface of the integrated circuit die.

7. The method as claimed in claim 5 wherein molding the encapsulation on the integrated circuit die and the connection post includes:
   positioning a mold chase over the integrated circuit die and the connection post; and
   molding the encapsulation on the integrated circuit die and the connection post between the mold chase and the substrate.

8. The method as claimed in claim 5 further comprising attaching with an internal interconnect the integrated circuit die to the substrate.

9. The method as claimed in claim 5 wherein molding the encapsulation includes molding a top encapsulation surface of the encapsulation coplanar with the post top and the top die surface.

10. An integrated circuit packaging system comprising:
    a substrate;
    a connection post formed on the substrate, the connection post having a post top and a post side;
    an integrated circuit die mounted on the substrate, the integrated circuit die having a top die surface; and
    an encapsulation molded on the integrated circuit die and the connection post, the encapsulation including the encapsulation having a connector recess in the encapsulation around the connection post exposing a portion of the post side, wherein the connector recess is a funnel-shaped recess centered around the connection post.

11. The system as claimed in claim 10 wherein:
    the encapsulation includes a top encapsulation surface of the encapsulation coplanar with the post top; and
    further comprising:
    an external interconnect attached to the substrate.

12. The system as claimed in claim 10 wherein the encapsulation fully covers the integrated circuit die.

13. The system as claimed in claim 10 wherein the connection post includes the post top lower than the top die surface.

14. The system as claimed in claim 10 further comprising an external interconnect attached to the substrate.

15. The system as claimed in claim 14 wherein the top die surface of the integrated circuit die is exposed through the encapsulation.

16. The system as claimed in claim 14 wherein the post top is coplanar with a top encapsulation surface of the encapsulation.

17. The system as claimed in claim 14 further comprising an internal interconnect attached to the integrated circuit die and the substrate.

18. The system as claimed in claim 14 wherein a top encapsulation surface of the encapsulation is coplanar with the post top and the top die surface.

* * * * *